US007432566B2

(12) United States Patent
Rotondaro et al.

(10) Patent No.: US 7,432,566 B2
(45) Date of Patent: Oct. 7, 2008

(54) METHOD AND SYSTEM FOR FORMING DUAL WORK FUNCTION GATE ELECTRODES IN A SEMICONDUCTOR DEVICE

(75) Inventors: Antonio L. P. Rotondaro, Dallas, TX (US); Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 114 days.

(21) Appl. No.: 10/911,165

(22) Filed: Aug. 4, 2004

(65) Prior Publication Data

US 2005/0006711 A1 Jan. 13, 2005

Related U.S. Application Data

(62) Division of application No. 10/254,396, filed on Sep. 25, 2002, now Pat. No. 6,794,252.

(60) Provisional application No. 60/325,791, filed on Sep. 28, 2001.

(51) Int. Cl.
H01L 29/76 (2006.01)
(52) U.S. Cl. ........................ 257/407; 257/412
(58) Field of Classification Search ............ 257/407, 257/412
See application file for complete search history.

(56) References Cited

U.S. PATENT DOCUMENTS

| 6,027,961 | A | 2/2000 | Maiti et al. |
| 6,130,123 | A | 10/2000 | Liang |
| 6,214,679 | B1 | 4/2001 | Murthy et al. |
| 6,235,568 | B1 | 5/2001 | Murthy et al. |
| 6,383,879 | B1 | 5/2002 | Kizilyalli et al. |
| 6,518,106 | B2 | 2/2003 | Ngai et al. |

(Continued)

FOREIGN PATENT DOCUMENTS

EP    1211729 A    6/2002

(Continued)

OTHER PUBLICATIONS

Polishchuk, Igor et al.; "Dual Work Function Metal Gate CMOS Technology Using Metal Interdiffusion", IEEE Electron Device Letters, IEEE Service Center, New York, NY, US, vol. 22, No. 9, Sep. 1, 2001, pp. 444-446, XP001083100, ISSN: 0741-3106.

(Continued)

*Primary Examiner*—Jack Chen
(74) *Attorney, Agent, or Firm*—Frederick J. Telecky, Jr.; Wade J. Brady, III

(57) ABSTRACT

A method is provided for forming dual work function gate electrodes. A dielectric layer is provided outwardly of a substrate. A metal layer is formed outwardly of the dielectric layer. A silicon-germanium layer is formed outwardly of the metal layer. A first portion of the silicon-germanium layer is removed to expose a first portion of the metal layer, with a second portion of the silicon-germanium layer remaining over a second portion of the metal layer. A silicon-germanium metal compound layer is formed from the second portion of the silicon-germanium layer and the second portion of the metal layer. A first gate electrode comprising the first portion of the metal layer is formed. A second gate electrode comprising the silicon-germanium metal compound layer is formed.

6 Claims, 2 Drawing Sheets

U.S. PATENT DOCUMENTS

2004/0018681 A1* 1/2004 Pham et al. ............... 438/257

OTHER PUBLICATIONS

Ku, Ja-Hum et al.; "High Performance pMOSFETs with Ni(SixGe1-x)/Poly-SiO.8Ge0.2 Gate" 2000 Symposium on VLSI Technology. Digest of Technical Papers. Honolulu, Jun. 13-15, 2000; (Symposium on VLSI Technology), New York, NY; IEEE, U.S., Jun. 13, 2000, pp. 114-15, XP000970784, ISBN: 978-0-7803-6309-9.

Lee. Wen-Chen et al.; "Optimized Poly-Si1-xGex-Gate Technology for Dual Gate CMOS Application" 1998 Symposium on VLSI Technology. Digest of Technical Papers. Honolulu, Jun. 9-11, 1998: (Symposium on VLSI Technology), New York, NY; IEEE, U.S., vol. Conf. 18, Jun. 9, 1998, pp. 190-191, XP0000802798, ISBN: 978-0-7803-4771-7.

Hsiao, Tommy Co. et al.; "Advanced Technologies for Optimized Sub-Quarter-Micrometer SOI CMOS Devices" IEEE Transactions on Electron Devices, IEEE Service Center, Piscataway, NJ, U.S., vol. 45, No. 5, May 1, 1998, XP011016523, ISSN: 0018-9383 (Section "B. Gate Work-Function Engineering" starting on p. 1093).

* cited by examiner

METHOD AND SYSTEM FOR FORMING DUAL WORK FUNCTION GATE ELECTRODES IN A SEMICONDUCTOR DEVICE This application is a divisional of application Ser. No. 10/254,396, filed on Sep. 25, 2002, now U.S. Pat. No. 6,794,252 and which in turn claims priority to provisional application Ser. No. 60/325,791 filed on Sep. 28, 2001.

TECHNICAL FIELD OF THE INVENTION

This invention relates generally to semiconductor manufacturing and more particularly to a method and system for forming dual work function gate electrodes in a semiconductor device.

BACKGROUND OF THE INVENTION

Modern electronic equipment such as televisions, telephones, radios and computers are generally constructed of solid state devices. Integrated circuits are preferred in electronic equipment because they are extremely small and relatively inexpensive. Additionally, integrated circuits are very reliable because they have no moving parts, but are based on the movement of charge carriers.

Typically, as the fabrication of integrated circuits has improved, the thickness of many layers formed in the integrated circuits has been reduced. For example, in the relatively recent past, conventional transistor gate dielectric layers had a thickness on the order of 100 Å. However, more recently, these layers have been formed with a thickness on the order of 20 Å. This trend toward thinner gate dielectric layers may continue, as thinner layers reduce device size and facilitate improved device performance.

However, disadvantages associated with thinner gate dielectrics include the proportionally increased dielectric effect corresponding to a depletion region at the interface between the gate dielectric and a polysilicon gate layer formed over the gate dielectric. Typically, the depletion region provides the electrical equivalent of an insulator approximately 3 Å thick.

Thus, continuing with the preceding example, for a 100 Å thick gate dielectric, a depletion region of 3 Å effectively increases the overall insulation between the gate and the underlying transistor channel from 100 Å to 103 Å. As such, for thicker gate dielectrics, the effect of the depletion region may be considered to have a negligible impact on the gate dielectric. In contrast, however, for a 20 Å thick gate dielectric, a depletion region of 3 Å increases the gate insulator to 23 Å, which is an increase of approximately 15 percent. This may result in a significant reduction in the benefits otherwise provided by the thinner gate dielectric.

One approach to avoiding the depletion region effect of polysilicon transistor gates uses metal as an alternative material for the transistor gate because metal does not present a considerable depletion region, if any. Problems with this approach include the fact that each metal has a single corresponding work function; however, the desired work function values for different transistor types are not the same. Thus, metal gates result in problems with CMOS circuits, which include both PMOS and NMOS transistors. Specifically, because a metal gate provides only a single work function, two different work functions are not provided for the PMOS and NMOS devices with one metal.

A more recent approach to avoiding the depletion region effect of polysilicon transistor gates provides for the formation of a set of transistor gates where one gate is formed from a metal and the other gate is formed from a corresponding metal silicide. Each transistor gate may then have a different work function. However, with this approach, the work functions provided by the metal and its corresponding metal silicide may not be adjustable.

SUMMARY OF THE INVENTION

In accordance with the present invention, a method and system for forming dual work function gate electrodes in a semiconductor device are provided that substantially eliminate or reduce disadvantages and problems associated with previously developed systems and methods. In particular, a metal or other suitable element and its corresponding silicon-germanium metal compound are used to provide two different work functions for two different types of gate electrodes, with one of the work functions adjustable by varying the silicon-to-germanium ratio.

In one embodiment of the present invention, a method is provided for forming dual work function gate electrodes in a semiconductor device. A dielectric layer is provided outwardly of a substrate. A metal layer is formed outwardly of the dielectric layer. A silicon-germanium layer is formed outwardly of the metal layer. A first portion of the silicon-germanium layer is removed to expose a first portion of the metal layer, with a second portion of the silicon-germanium layer remaining over a second portion of the metal layer. A silicon-germanium metal compound layer is formed from the second portion of the silicon-germanium layer and the second portion of the metal layer. A first gate electrode comprising the first portion of the metal layer is formed. A second gate electrode comprising the silicon-germanium metal compound layer is formed.

In another embodiment of the present invention, an integrated circuit comprising dual work function gate electrodes is provided. The integrated circuit includes a first gate electrode and a second gate electrode. The first gate electrode comprises a metal layer and has a first work function. The second gate electrode comprises a silicon-germanium metal compound layer and has a second work function. The silicon-germanium metal compound layer is formed from a silicon-germanium layer and the metal layer.

Technical advantages of the present invention include providing an improved method for forming dual work function gate electrodes in a semiconductor device. In a particular embodiment, a metal or other suitable element and its corresponding silicon-germanium metal compound are used for two different types of gate electrodes. As a result, one of the work functions is adjustable based on the silicon-to-germanium ratio in the silicon-germanium metal compound. Accordingly, two different work functions, one of which may be fine-tuned to desired a value, are provided for the two different types of gate electrodes.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like numerals represent like parts, in which.

DETAILED DESCRIPTION OF THE INVENTION

Figure 1A:
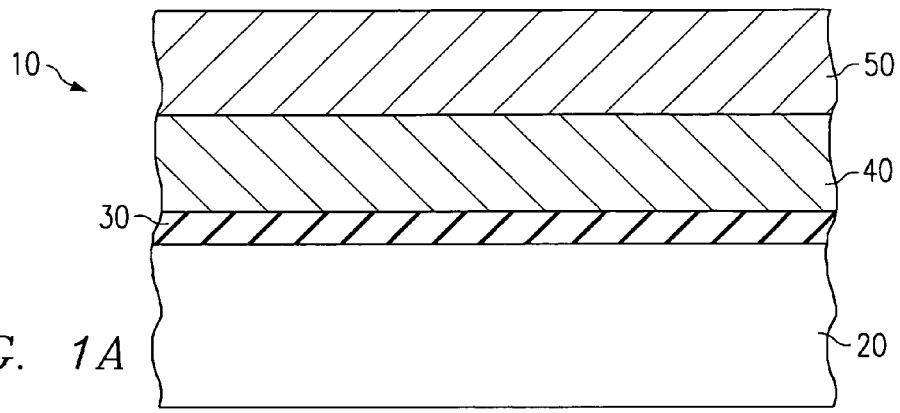
FIGS. 1A-E are a series of schematic cross-sectional diagrams illustrating a method for forming dual work function gate electrodes in a semiconductor device in accordance with one embodiment of the present invention.

Referring to FIG. 1A, an initial structure 10 for an electronic circuit comprises a substrate 20, a dielectric layer 30, a metal layer 40, and a silicon-germanium layer 50. The substrate 20 may comprise a semiconductor wafer or other suitable structure as a base on which an integrated circuit may be formed. According to one embodiment, the substrate 20 comprises silicon.

The dielectric layer 30 is formed over the substrate 20. The dielectric layer 30 is a conformal layer that may be deposited by chemical vapor deposition or other suitable means. The dielectric layer 30 comprises a material that may function as a gate dielectric for complementary PMOS and NMOS transistors. For example, the dielectric layer 30 may comprise silicon dioxide, a silicon oxynitride, such as HfSiON, or other suitable dielectric material. The dielectric layer 30 may be about 6 to about 80 Å thick.

The metal layer 40 is formed over the dielectric layer 30. According to one embodiment, the metal layer 40 comprises cobalt. However, it will be understood that the metal layer 40 may comprise any suitable metal or other conductive material without departing from the scope of the present invention. The metal layer 40 may be about 15 to about 1,000 Å thick.

The silicon-germanium layer 50 is formed over the metal layer 40. The silicon-germanium layer 50 may be about 15 to about 2,500 Å thick. The silicon-germanium layer 50 comprises silicon and germanium. The ratio of silicon to germanium in the silicon-germanium layer 50 is selected based on the material comprising the metal layer 40 and based on a desired work function. Thus, by varying the ratio of silicon to germanium in the silicon-germanium layer 50, the work function for a corresponding gate electrode may be adjusted to a desired value.

According to one embodiment, the silicon-germanium layer 50 is polycrystalline or amorphous. The silicon-germanium layer 50 is a conformal layer that may be deposited by any suitable means, preferably ensuring little or no reaction between the silicon-germanium layer 50 and the metal layer 40. For example, a sputter technique, which may be carried out at relatively low temperatures, may be used. Alternatively, a plasma-enhanced chemical vapor deposition, which may also be carried out at relatively low temperatures, may be used. In addition, a thermal chemical vapor deposition process may be used, provided that the temperature is kept at a level that will ensure that the process does not cause a reaction between the metal layer 40 and the silicon-germanium layer 50.

Figure 1B:
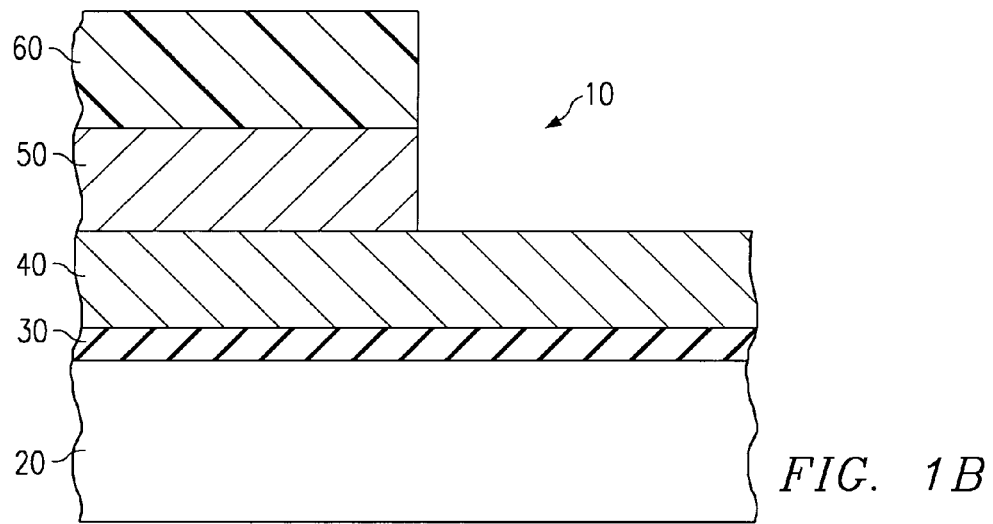

Referring to FIG. 1B, a mask 60 is conventionally formed outwardly of the silicon-germanium layer 50. The mask 60, which comprises a material that is sensitive to light, is patterned through a process that generally includes photolithography and etching. The mask 60 forms a pattern that corresponds to gate electrodes that are formed as described in more detail below, with the material of the mask 60 removed from the structure 10 over portions corresponding to a gate electrode with a first work function and remaining on the structure 10 over portions corresponding to a gate electrode with a second work function. Although not shown in FIG. 1B, the mask 60 also forms a pattern corresponding to other gate electrodes, if any, that are to be formed in the structure 10.

The portion of the silicon-germanium layer 50 that is exposed by the mask 60 is removed by an etch process that is selective to the metal layer 40, while the remaining portion of the silicon-germanium layer 50 is protected by the mask 60. According to one embodiment, the etch is a dry etch, such as an HBr-based dry etch. However, it will be understood that any suitable etch process may be used without departing from the scope of the present invention.

Figure 1C:
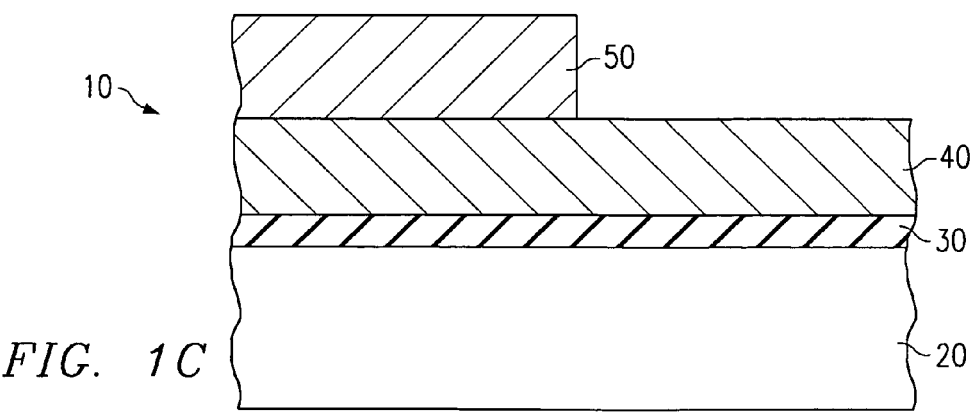

Referring to FIG. 1C, the mask 60 is removed with a resist-stripping process. For example, the resist-stripping process may comprise either an oxygen or a hydrogen ash process. However, an oxygen process may pose a risk of oxidation of the metal layer 40 where the metal layer 40 is exposed. As another example, a solvent may be used. In this case, the solvent comprises a material that will not damage either the silicon-germanium layer 50 or the exposed metal layer 40.

After the mask 60 has been removed and the remaining silicon-germanium layer 50 is exposed, an anneal step is performed. The anneal step may be performed at various temperatures and for varying lengths of time. For example, a rapid thermal processing ("RTP") operation may be used to perform a relatively short anneal at a temperature of 500° C. or greater. However, it will be understood that any suitable anneal process may be performed without departing from the scope of the present invention.

Figure 1D:
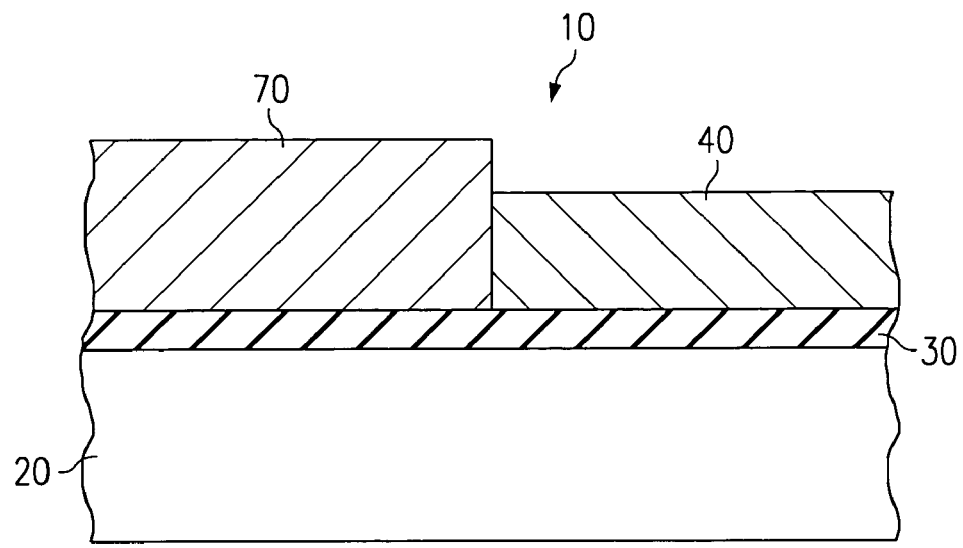

During the anneal process, the silicon-germanium layer 50 reacts with the portion of the metal layer 40 underlying the silicon-germanium layer 50, forming a silicon-germanium metal compound 70, as illustrated in FIG. 1D. The temperature used in the anneal step may determine the composition of the silicon-germanium metal compound 70.

The thickness of the silicon-germanium layer 50 may affect the extent to which the material in the metal layer 40 is converted to a germano-silicide. Thus, according to one embodiment, the silicon-to-germanium ratio, the thickness and the subsequent anneal process of the silicon-germanium layer 50 may be selected so as to achieve a pre-determined composition for the silicon-germanium metal compound 70. For another embodiment, the silicon-germanium layer 50 may be relatively thick such that not all of the silicon-germanium layer 50 is consumed during the anneal step. Using this approach, a portion of the structure 10 is etched after the anneal in order to remove the unconsumed portion of the silicon-germanium layer 50, resulting in the silicon-germanium metal compound 70 as illustrated in FIG. 1D.

Figure 1E:
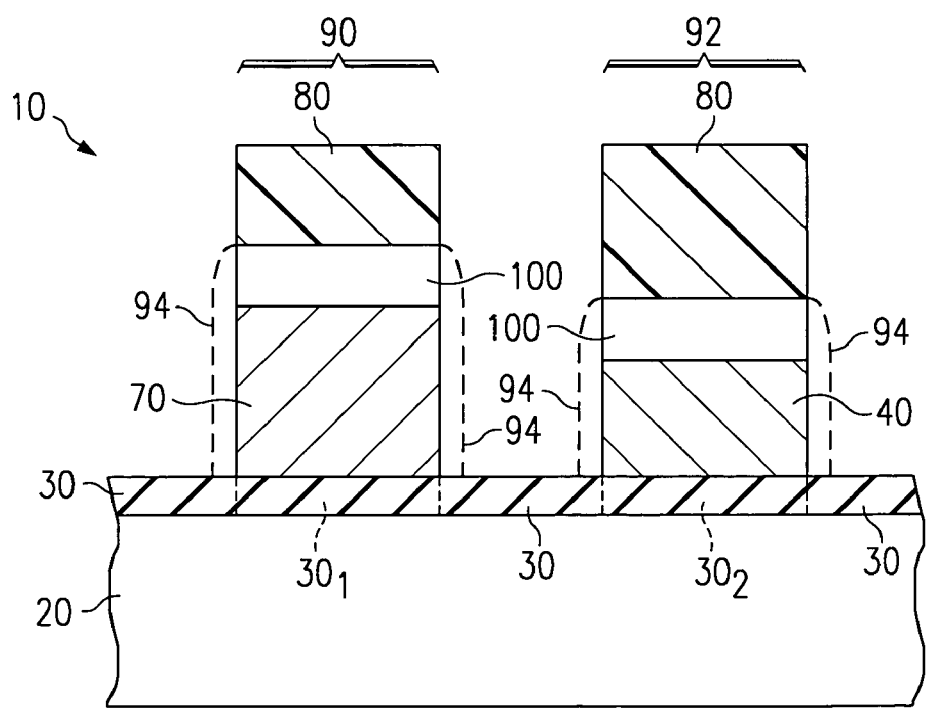

Referring to FIG. 1E, a photoresist layer is formed and patterned over the structure 10, resulting in a mask 80 over the metal layer 40 and the silicon-germanium metal compound 70. An etch may then be performed down to the dielectric layer 30. The resulting structures each comprise a gate electrode 90 and 92.

The gate electrode 90 comprises a silicon-germanium metal compound layer 70 and a portion of the dielectric layer 30, which separates the silicon-germanium metal compound layer 70 from the substrate 20. Thus, this portion of the dielectric layer 30 serves as a gate insulator for the gate electrode 90. The gate electrode 92 comprises a metal layer 40 and a portion of the dielectric layer 30, which separates the metal layer 40 from the substrate 20. Thus, this portion of the dielectric layer 30 serves as a gate insulator for the gate electrode 92.

The gate electrodes 90 and 92 comprise structures from which two different transistors may be formed, where the gate of each transistor has a different work function based on the different material for each gate electrode 90 and 92. For example, an NMOS transistor may be formed by the gate electrode 90 with a gate having the work function of the silicon-germanium metal compound layer 70, while a PMOS transistor may be formed by the gate electrode 92 with a gate having the work function of the metal layer 40. Alternatively, a PMOS transistor may be formed by the gate electrode 90 with a gate having the work function of the silicon-germanium metal compound layer 70, while an NMOS transistor may be formed by the gate electrode 92 with a gate having the work function of the metal layer 40. As described above, the work function of the silicon-germanium metal compound layer 70 may be adjusted to a desired value by varying the silicon-to-germanium ratio in the silicon-germanium layer 50.

The mask 80 may be removed and insulating sidewalls 94 may be formed with respect to the gate materials and their underlying gate insulators. Additionally, various additional transistor aspects as readily ascertainable by one skilled in the art are not shown, but may be implemented with respect to the gate electrodes 90 and 92, including but not limited to n-wells or p-wells, source/drain regions, channel implants, isolation oxides, and the like. Moreover, some of these regions may be formed prior to the formation of the gate electrodes 90 and 92. For example, isolation regions may be formed to define boundaries for source/drain implants and a well of a given conductivity type, such as an n-well for a PMOS transistor, while others of these regions may be formed after the gate electrodes 90 and 92, such as the source/drain regions.

An optional clad layer 100 may also be formed in the gate electrodes 90 and 92 between the silicon-germanium metal compound layer 70 and the mask 80 and between the metal layer 40 and the mask 80. The inclusion of the clad layer 100 may be used for various purposes. For example, if the gate electrodes 90 and 92 are insufficiently thick, a clad layer 100 may be included to increase the height of the gate electrodes 90 and 92. As another example, if a lower sheet resistance is desired than that achieved without a clad layer 100, the clad layer 100 may be included to alter the sheet resistance. For this example, the clad layer 100 may comprise any suitable material that reduces the overall sheet resistance. These materials may include a conductive material such as metal. According to one embodiment, the clad layer 100 comprises a refractory metal, such as tungsten, tantalum, titanium, tungsten nitride, tantalum nitride, titanium nitride, and the like.

The resulting structure 10 provides a set of transistor gate electrodes 90 and 92 with one gate formed from a metal or other suitable element and another gate formed from a corresponding silicon-germanium metal compound. In this way, each transistor gate electrode 90 and 92 may have a different work function, and the work function for the silicon-germanium metal compound may be adjusted to a desired value based on the composition of the silicon-germanium layer 50. In addition, transistors may be formed using these gate electrodes 90 and 92 with relatively thin gate dielectrics, and the overlying metal or silicon-germanium metal compound gate will have no substantial depletion region.

Although the present invention has been described with several embodiments, various changes and modifications may be suggested to one skilled in the art. It is intended that the present invention encompass such changes and modifications as fall within the scope of the appended claims.

What is claimed is:

1. An integrated circuit, comprising:
  a first gate electrode comprising a metal layer, the first gate electrode having a first work function; and
  a second gate electrode comprising a silicon-germanium metal compound layer, the silicon-germanium metal compound layer formed from a silicon-germanium layer and the metal layer, the second gate electrode having a second work function different from the first work function.

2. The integrated circuit of claim 1, the metal layer comprising cobalt.

3. The integrated circuit of claim 1, wherein the silicon-germanium layer is about 15 Å to about 2,500 Å thick.

4. The integrated circuit of claim 1, wherein the silicon-germanium layer comprises a silicon-to-germanium ratio based on a desired value for the second work function.

5. The integrated circuit of claim 1, the first gate electrode comprising a first portion of a dielectric layer, the metal layer formed outwardly of the first portion of the dielectric layer, and the second gate electrode comprising a second portion of the dielectric layer, the silicon-germanium metal compound layer formed outwardly of the second portion of the dielectric layer.

6. The integrated circuit of claim 5, the first gate electrode comprising a first clad layer formed outwardly of the metal layer and the second gate electrode comprising a second clad layer formed outwardly of the silicon-germanium metal compound layer.

* * * * *